United States Patent [19]

Matthews

[11] Patent Number: 5,432,510

[45] Date of Patent: Jul. 11, 1995

[54] AMBIDEXTROUS SINGLE HAND CHORDIC DATA MANAGEMENT DEVICE

[76] Inventor: Walter S. Matthews, 465 Trowbridge La., Folsom, Calif. 95630

[21] Appl. No.: 34,901

[22] Filed: Mar. 22, 1993

[51] Int. Cl.⁶ .............. B41J 5/08; G06F 3/02; H03K 17/94
[52] U.S. Cl. ...................... 341/20; 341/21; 341/22; 364/709.12; 364/709.16; 400/473; 400/489
[58] Field of Search .............. 341/20, 21, 22; 364/709.12, 709.14, 709.15, 709.16; 400/479, 489, 492, 472, 473

[56] References Cited

U.S. PATENT DOCUMENTS

| | | | |
|---|---|---|---|
| 3,022,878 | 2/1962 | Siebel | 364/920 |
| 4,360,892 | 11/1982 | Endfield | 364/419.15 |
| 4,414,537 | 11/1983 | Grimes | 341/20 |
| 4,442,506 | 4/1984 | Endfield | 364/920 X |
| 4,517,424 | 5/1985 | Kroczynski | 200/52 R |
| 4,791,408 | 12/1988 | Heusinkveld | 364/189 |
| 4,905,001 | 2/1990 | Penner | 341/20 |
| 4,998,457 | 3/1991 | Suzuki | 84/600 |
| 5,267,181 | 11/1993 | George | 364/709.12 |

OTHER PUBLICATIONS

Chappell Brown, Mar. 8, 1993 Electronic Engineering Times.
International—"Newsweek" Feb. 22, 1993, p. 48.
L. R. Shannon, New York Times, Mar. 15, 1993 "Byte" Magazine, Carol Swartz Mar. 1992.
Ralph Needelmen, InfoWorld, Aug. 12, 1991.
Mini Bat (Agenda) Brochure from InfoGrip.
Mike Hanlon, MacNews, Jul. 1991 "Chordable input".
NASA Tech Briefs, Dec. 1992.

Primary Examiner—John K. Peng
Assistant Examiner—Daniel J. Wu
Attorney, Agent, or Firm—Bernhard Kreten

[57] ABSTRACT

An ambidextrous, single hand data management device that has been ergonomically optimized to facilitate multiple key per character input, chording. The device has an arrangement of multiple keys which are so situated that the device can be held in either the left or the right hand, by a large range of hand sizes, and data can be quickly and conveniently input, that is, any combination of keys can be quickly and conveniently actuated with a "Microwriting" chordic type of data input, without a hand strap and without dropping the device. The ergonomic arrangement of keys on the casing allows for the device to remain stationary relative to the palm of the hand while that hand is in a multiplicity of orientations. The device can serve as a primary data input device or as a data storage and retrieval device for things like inventory control, names and addresses or daily schedule reminders or, as a combination of all of these. The device is primarily a mobile data input device that allows access to the entire keyboard of characters without the need to look while data are being input but which provides a visual feedback if desired as to what is being input with an LCD. The information in the device can be conveniently and easily uploaded into a computer via a serial cable adapter.

19 Claims, 3 Drawing Sheets

AMBIDEXTROUS SINGLE HAND CHORDIC DATA MANAGEMENT DEVICE

FIELD OF THE INVENTION

This invention relates to an ambidextrous, single hand, data management device. The application of the device in today's computer environment has been to the rapidly emerging area of personal information management. It can be used as a simple note taker, a keyboard for a computer, a specialized information input and storage device, a user customize-able learning tool or, as the core of a host of electronic devices.

BACKGROUND OF THE INVENTION

1. Technical Field

This invention is related to computer peripheral equipment and more particularly to hand held portable computer equipment 2. Background Information Prior art for single hand keyboards represents multiple attempts to invent alternative devices for the QWERTY keyboard for data entry. Perhaps the most important data point is that almost none of the inventions for one hand data entry has made it into a commercial product. The de facto standard input device for all computer systems, is the QWERTY arrangement of one key for one character data input. A commercial product that provides an alternative to QWERTY data entry in a pocket sized device is the "Agenda" made by Microwriter Inc. of London Eng. The "Agenda" uses only seven keys for data entry, five primary keys and two shift keys, and by pressing various combinations of keys up to a maximum of five keys at a time, all the characters of a conventional keyboard can be generated. The "Agenda" has failed to generate a profitable business, however, and it has been removed from the market. Thus, there has been no real progress to replace the QWERTY keyboard except in severely limited applications where the QWERTY arrangement simply won't work, like, for example, specialized chord key boards for people with only one arm or joy stick operated devices which have been devised for the severely handicapped.

There is extensive prior art in the area of single hand data input devices. For example Siebel et. al. in 1962 in U.S. Pat. No. 3,022,878 described an invention of a "man machine communication device that surrounds the hand and is remote from the controlled machine . . . to provide a keyboard into which the hand is inserted . . . " This device allowed for a large number of possible input signals with a single hand and allowed relatively "free movement of the hand" while data is being entered.

In 1983, Grimes was issued U.S. Pat. No. 4,414,537 for a "man machine interface . . . for translating discrete hand positions into electrical signals representing alphanumeric characters. The interface comprises a glove . . . ". Similarly, in 1985 Kroczynski was issued U.S. Pat. No. 4,517,424 in which the functional elements of a data glove were incorporated into a device which "engages the hand . . . and maintains same in a fixed position while permitting movement of the fingers." Some earlier examples of related devices are a finger tip actuated solenoid device for the handicapped described by Karafian in 1967 in U.S. Pat. No. 3,507,376; a one handed code registration device described by Laenger in 1976 in U.S. Pat. No. 4,074,444; and also in 1976 Salmon described a one hand communication device for the dumb in U.S. Pat. No. 4,075,621.

In 1974, Hilborn, in a patent issued to the U.S. Government in U.S. Pat. No. 3,833,765 describes a pocket sized typewriter that uses sequential keying to uniquely define each character. This sequential keying of data, where multiple keys are sequentially struck and released, should be distinguished from the chording type of input, "Microwriting", described by Endfield. In "Microwriting" specific keys are pressed in any order and a character is recorded only when all keys are released.

The characteristic of "Microwriting" that allows keys to be struck in any order and to register a character only after all keys have been released is part of the foundation for the present invention. There have been other devices which are superficially similar in appearance to the present device but they operate in an entirely different way and if they were applied to "Microwriting" they would not work.

For example in 1988, U.S. Pat. No. 4,791,408 was issued to Heusinkveld in which he described a "data entry device having five keys, not in one plane, (which) is held in and operated by one hand. Each key has two 'on' positions and one 'off' position." The user of Heusinkveld's device must keep their fingers on the keys of his device at all times and although he uses discrete chords to register specific characters he does not employ the elements of "Microwriting" in which a simple down-close-on/release-off switch is crucial. If "Microwriting" were to be used on Heusinkveld's device, the device would be dropped upon release of the keys if the hand were, for example, positioned so that the palm was pointing down. Moreover, if the elements of "Microwriting" were to be employed with Heusinkveld's device using the keys as they are described, it would require two motions of each finger to register a chord, a forward motion to register a signal followed by a return motion. In Heusinkveld's patent, the independent claim, number 1, states "means for introducing several digital logic signals . . . accomplished by . . . movements of keys . . . four of said keys mounted on one side of said casing, one key mounted on the opposite side of said casing; each said key being associated with two contacts, and said keys being slide-able along the plane of the surface of the outside of the casing . . . generating a different digital logic signal at each slide position that is controlled by the tip of the each finger or the tip of the thumb." which identifies that the fingers never leave the keys. Moreover, Heusinkveld's device is neither ambidextrous nor is it able to accommodate a large variety of hand sizes since only the tips of the fingers would be useful in actuating the keys.

Another self-contained, right hand, multiple key per character, data input, storage and retrieval device has been embodied in a commercial machine known as the Agenda. The multiple key per character input scheme for a right hand, called Microwriting, is used in the Agenda and this chording scheme, as well as patent claims for the Agenda, are described by Endfield in U.S. Pat Nos. 4,443,789 and 4,360,892. The Agenda device, however, embodies a keyboard that is designed so that all keys are actuated in the same direction, namely down and away from the face of the Agenda, and therefore an auxiliary surface has to be provided for the unit to rest on, such as a desk top or another hand, in order to allow data to be entered.

The present invention is an improvement on Heusinkveld's invention as well as an improvement of the Agenda. Microwriting is, albeit limited, a market proven standard for chording which has been shown to be easy to learn, and Microwriting cannot be used on Heusinkveld's device because all the keys must be released to effect a chord and if all the buttons on Heusinkveld's device were to be released, the unit would fall from the hand.

The arrangement of buttons in the invention described here has been designed to allow single hand operation with either the left or right hand without the need for a secondary surface or another hand as Endfield's device requires. Moreover, the placement of the specific keys allows for comfortable operation of the device by a large range of left or right hands over a large variety of hand sizes and this has been done in such a way that a hand strap is not needed to hold the device. The fundamental aspects of Microwriting have been used in this invention but the similarity has only to do with the specific key combinations that are required to make specific letters and characters.

Other U.S. patents have been issued more recently which cover different implementations of single handed data entry such as U.S. Pat. No. 4,905,001 issued in 1990 to Penner in which a device remarkably similar to Heusinkveld's is described. The unique aspects of Penner's invention have to do with his devices ability to facilitate two way communication with a hand held device since the individual finger keys of Penner's device actually send tactile information back to the user based on information coming into the device. Another hand held invention was described in U.S. Pat. No. 4,998,457 by Suzuki et. al. in 1991 in which an input device for music was described. This device allows for the measurement of variable force and the translation of that variable force into differentiated music.

In 1985 Crimmins was issued U.S. Pat. No. 4,516,939 in which he described a two handed eight finger and two thumb chording device which, similar to Penner's device, gives the user tactile feedback. Crimmins uses the elements of his device as a training aid to teach people how to use his device. His device is entirely different from the device described here, but Crimmins did claim the use of his device to train people how to use that same device.

The December issue of 1992 NASA tech briefs (p15) and the Mar. 8, 1993 issue of Electronic Engineering Times (p59) describe a device called the "Data Egg" invented by Gary Friedman, Friedman's device incorporates and has reduced to practice, many of the elements of Heusinkveld's invention. He has also added the elements of Microwriting to make a single hand chording device. However, Friedman's device 1) is not ergonomically useful to a variety of hand sizes, 2) has the thumb press button on top of his device which eliminates the use of that device in many positions of the hand unless a back of the hand strap used to stabilize his device because pushing the thumb button for the space command tends to push Friedman's data Egg out of the hand, 3) does not incorporate an LCD display, although a screen is simulated with a piece of tape, and 4) it can not be used by the left or right hand interchangeably, i.e. it is not ambidextrous.

The March 1992 issue of Byte Magazine describes a hand held, single hand keyboard called the Twiddler that is manufactured by Handykey Corporation. The "Twiddler" is based on a chording scheme that was devised by Handykey Corp. and it in no way resembles "Miocrowriting" in that twelve keys are available for the fingers and six buttons are available for the thumb. There is the similarity that keys are pressed and released in chord fashion with one hand. The Twiddler is also a mouse and connects to conventional PC's through both the serial port and the Keyboard port. The Twiddler is a keyboard replacement and although it is a single hand device, it does not stand alone as a functional device and it does not incorporate any of the features of the present invention, such as the face mounted LCD, the face mounted thumb keys, five digit "Microwriting", hand size optimization, internal memory or the host of functions that accrue from the use of a stand alone self contained device like the present invention.

OBJECTS AND ADVANTAGES

Accordingly, several objects and advantages of my invention are:
(a) to provide a light, pocket sized device which can be used with either hand interchangeably in a touch typing-chording mode, i.e. without needing to look at the device to enter data in any language;
(b) to provide a device for data entry and storage in a generally useful shape which can be used by a wide variety of hand sizes
(c) to provide for a data entry and retrieval device that can be used with only one hand without the need for a secondary surface, an additional hand or a back strap for the hand in order to support the device while the hand securely holding the invention is in any orientation of the hand relative to free space, i.e., upside down, sideways, etc.
(d) to provide a device that can teach a user how to use that device without reference to a user's manual and without external instructions.
(e) to provide a convenient and more efficient tool than is currently available for learning information that is compiled in list form, i.e., vocabulary for a foreign language, states and capitals in Geography, etc.
(f) to provide a platform which uses two of the devices, one for each hand, and will provide the capability to enter data, as in court recording, at close to the rate people can generate that data.

Still further objects and advantages are to provide a platform for further development in this form factor which will include a complete computer, a personal communication capability, text to speech capability so that the unit can enable the dumb to communicate;

THE DRAWINGS

SUMMARY OF THE INVENTION

Figure 1:
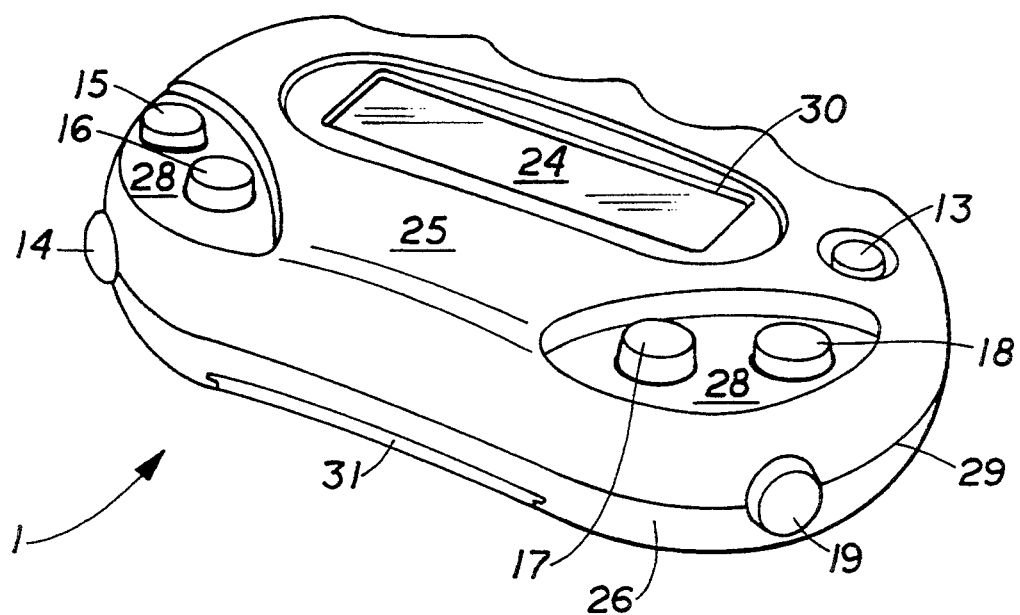
FIG. 1 is a perspective view of the invention at 45 degrees looking from the top and from the back with the finger keys away from the view.

The invention described here is an ambidextrous, single-hand, data management device that has been ergonomically optimized to facilitate multiple key-per-character data input in any language which is called chording. All the keys on this invention are simple, "down close" only, single-pole, momentary, push button switches. A specific kind of chording has been implemented which generates characters when any combination of buttons are depressed and then released. This chording scheme has been commercially implemented in a British commercial device called "The Agenda", however, unlike "The Agenda", the arrangement of keys on this ambidextrous device has been designed to allow single hand operation with either the left or right hand without the need for support from a secondary surface, another hand or, from a back-of-the-hand strap. The placement of the specific keys in the casing allows for comfortable operation of the device by a large range of hand sizes, from ten year old children through to six-foot-six-inch tall basketball players. The accommodation for such a wide range of hand sizes has been achieved by taking advantage of the fact that the spacing between human fingers gets wider as the hand is opened. Moreover, once the device is securely gripped in a stable and comfortable position in the hand, chording can be accomplished while that hand is in a full range of hand positions without danger of dropping the device.

The placement of the left and right thumb keys is on the face of the device. In "Microwriting" this thumb key gets pushed in the same direction as other keys and in combination with other keys when generating many of the characters as well as every time a space command is entered. Therefore, the thumb key has to be easy to initialize and, most importantly for an unsupported single-hand hand-held unit, hitting the thumb key does not push the device out of the hand. By placing this key on the face side of the casing, the thumb key can be pushed without depressing the finger buttons and without moving the device in the hand. Moreover, the role of each key in the device changes depending on whether the unit is being used by the left hand or by the right hand. In the simplest implementation, pushing the left hand thumb key converts the entire unit automatically into a left handed chording device.

The design has been put together in such a way that part of the static random access memory, SRAM, memory space can be allocated to execution code for the microprocessor, which allows the unit to be completely user-programmable. With proper download code, the device can serve as a primary data input device or as a data storage and retrieval device for things like inventory control, names and addresses, daily schedule reminders or, as a combination of all of these. Thus, forms of all kinds, systematic inventory counting and a special version of programmed learning can be accomplished with the device. The device is primarily a mobile data input device that allows access to the entire keyboard of characters without the need to look at the device while data are being input but which provides a visual feedback by means of an LCD as to what is being input.

The code assignment of any and all the keys is user selectable so that if a chording sequence other than Microwriting, such as the "Bat Chords" used by Infogrip, or, any other chord set or coding sequence is desired, it is a simple matter for the user to reassign a key designation. Thus, assignment of specific chords to specific letters, words, word sequences or even to graphic symbols or sounds is something that is selectable by the user. The assignments of the specific code sequences are made by the user on a computer and these assignments are downloaded from that computer to the device. In the absence of a downloaded code translation table resident in the ambidextrous device's Static Random Access Memory (SRAM), the unit will default to the Microwriter chord sequence that is stored in Read Only Memory within the microprocessor.

A specific download program has been developed that allows the unit to present on the LCD screen a programmed sequence of letters, numbers, or symbols in a seemingly random order. The screen will first show a specific letter. If that letter is properly chorded the unit will present the next letter, however if the space bar is pushed a graphic representation of the keys that have to be pressed to generate that character appears on the LCD screen of the unit. Once the chord is properly executed another character cycles onto the screen.

Two of these devices can be used in tandem by plugging one of them into the other, one of the two becoming a slave of the other. This function will allow for two handed operation of note taking and can even result, for example, in a complete phonetic alphabet, similar to court recording, which would result in a very fast rate of input.

DESCRIPTION OF THE PREFERRED EMBODIMENT

The Casing and Keys

Figure 2:
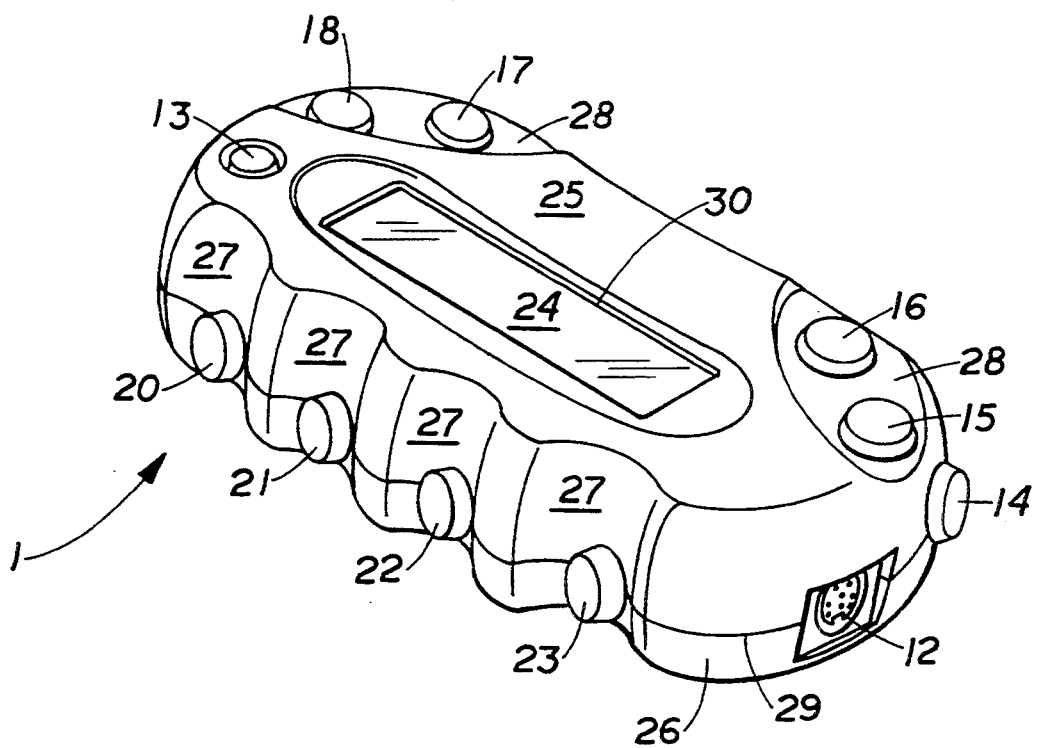
FIG. 2 is a perspective view of the invention at 45 degrees looking from the top and from the front with the finger keys toward the view.

An embodiment of the present invention is illustrated in FIG. 1 and FIG. 2. The plastic casing 25, 26 and 31 of this invention 1, generally shaped like a short, wide but thin hot dog bun, is four and a half inches long at the longest point, two and a half inches high and about an inch thick. In order to achieve ambidexterity the device has been designed so that most of the left half of the device is a mirror image of the right half of the device. The asymmetry of the device 1 is associated with the use of only one DIN connector 12 near the thumb keys for the left hand 14, 15 and 16, and one "On" key 13 near to and above the thumb keys for the right hand.

The casing comes in three pieces which are comprised of the face side 25, the back side 26 and the battery cover 31. The battery cover 31 is a flat, removable, rectangular piece of plastic that fits flat and flush onto the back side 26. The face side 25 and the back side 26 of the casing are held together by two screws that push through the back side and screw into the face side. The dividing line 29 between the two major parts of the casing 25 and 26 is below the center, away from the face side 25, toward the back side 26 of the casing.

All of the keys on the device are simple, down close, single-pole, momentary push button keys that have a travel of about one eighth of an inch and when closure of the switch is made, the switches make an audible click that can be felt by the finger initializing that particular key. The cap on the "On" key 13 is smaller than the rest of the keys and it is recessed within the face cover 25 of the casing. However, all of the actual switch devices are Model B3F-1152 made by Omron. The switches are mounted directly onto the PC board so that the final assembly involves closing the face and back pieces of plastic down onto the completely self contained PC board. When the pieces are snapped together the face and the back pieces completely enclose the key caps and are symmetrically wrapped around said key caps. Once the unit has been screwed together the only access to the inside of the unit that is required is to change the four AAA batteries that power the unit.

The Face Side

There is a large rectangular hole 30, about half an inch high and two and a half inches long, set into the face side of the casing 25. The rectangular hole 30 is set toward the thin, top, finger-key side and about a half an inch down from this it and the rectangular hole is centered, side to side, in the casing. A liquid crystal display (LCD) 24 device has been fitted into the rectangular hole. The LCD 24 can image two lines of 5×7 dot matrix characters with sixteen characters in each line. The LCD is an off-the-shelf device sold by Sharp Corp., model no. LM16257.

The face of the casing 25 has holes for four of the ten keys of the device 15, 16, 17 and 18. These keys are for actuation by either the left or right thumb and they have been symmetrically placed on opposite sides of the face near the edges of the LCD device. There are two keys for each thumb, with one set being beside the LCD 15 and 18, near the center of an imaginary extension of the bottom edge of the LCD and very close to the edge of the casing. The other two keys 16 and 17 have been placed below the area for the liquid crystal display near the center of an imaginary line extending vertically down from the far right and left edges of the LCD 24. The casing 25 can be conceptually considered to exhibit two equal halves including a right half and a left half about a plane of symmetry passing through the face side, top edge, back side and bottom edge. The thumb buttons 15,16,17 and 18 have been placed within a small trough 28 which allows the buttons to be lower than the rest of the face of the casing by about ⅜ of an inch. This trough 28 allows for a reduced circumferrential distance from the thumb keys, around the back of the device, to the finger keys 20, 21, 22 and 23. Minimizing the circumferrential distance from the thumb keys, around the back side of the device to the finger keys, was part of the design breakthrough that allowed for a wide range of hand sizes to be able to use this device comfortably.

There is also an "on" button 13 on the face of the device in the top right corner above the top thumb key 18. There is no specific "off" button on the device since the unit turns itself off automatically after a pre-selected time interval.

The top edge of the casing 27 along the thin, top, finger-side of the casing has been hollowed out with trough extensions that extend down into the face and allow fingers of large hands to comfortably overlap onto the face side of the device.

The Thin, Top, Finger-Side

There are four finger keys 20, 21, 22 and 23 that have been placed extending within a common finger key plane in the middle of the dividing line 29 between the face side casing 25 and the bottom side casing 26. The four finger keys include a right half end key 20, a right half middle key 21, a left half middle key 22 and a left half end key 23. Because the dividing line is not exactly in the center of the casing, the finger keys are about a third of the way down the side toward the back. This placement of the keys toward the back side of the casing, in conjunction with the trough 28 that has been made for the thumb keys, allows for a minimum circumferrential distance between the thumb keys and the finger keys. The thumb keys 15, 16, 17, 18 are oriented to move along lines substantially perpendicular to the finger key plane to assist in keeping the casing 25 within the hand when the thumb buttons 15, 16, 17, 18 are depressed. This minimum spacing is responsible for allowing small hands to grip the device and initialize the full range of chords with any combination of finger presses.

There are four troughs 27 on the thin, top, finger-side of the casing that run from the back side of the casing to the face side of the casing. The finger press keys are placed in the center of these troughs. The troughs function as guides to allow a tactile feedback that the fingers are in the correct position so that chording can occur without having to look at the device. These troughs also serve to help minimize, by a small amount, the circumferrential spacing between the thumb keys and the finger keys.

The Connector Side and Its Near Mirror Image

The serial port connector of the device 12 is a mini DIN, 8 pin connector near the thumb switches 14, 15 and 16 that would be used by the left hand. This DIN connector has been placed near the center of the thin circular side near the thumb keys for the left hand. Also on this side, orthogonal and close to the face side keys 15 and 16, is the other left hand thumb key 14.

Symmetrically opposite to the connector side is the side that would be actuated by the thumb of the right hand. The placement of the key on this side is exactly the mirror image of the placement of the key on the connector side except that there is no connector, however above the right hand thumb buttons on the face side is the "On" button 13.

Electronics

Figure 5:
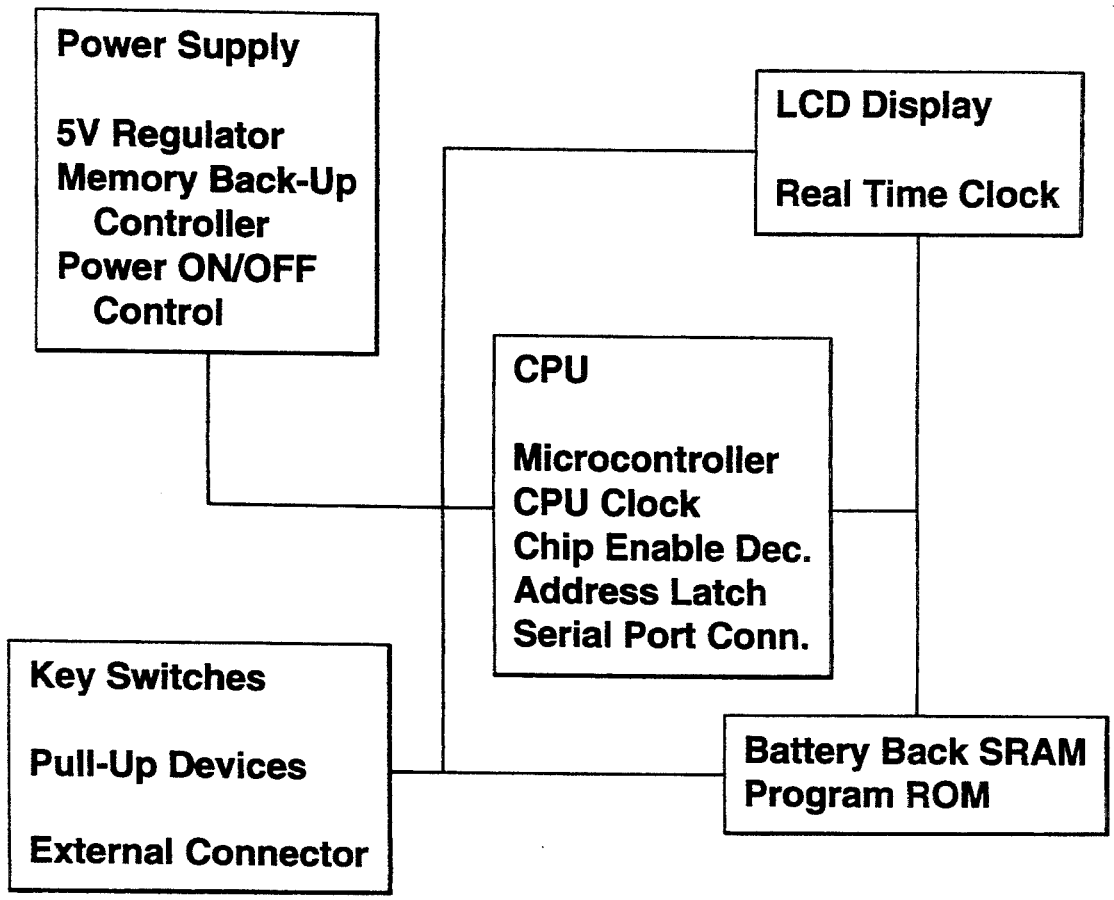
FIG. 5 is a block diagram of the circuitry used in the device.

The electronic circuitry used in this device is in no way unique and several design's have been implemented to achieve the result achieved here. In U.S. Pat. Nos. 4,443,789 and 4,360,892, Endfield described a general schematic for his hand held single hand word processor and his disclosure is cited here for reference only. In this invention we incorporated a somewhat different design that is diagrammed in FIG. 5. Specifically we have chosen to use a variation of the 8051 series of devices, the Signetics 87C654, as the microprocessor because it has 16K bytes of code storage space right on the microprocessor and one mega bit of external to the microprocessor, static random access memory (SRAM) from Toshiba, part number TC551001APL. The circuit has been designed so that a full 48K bytes of the SRAM memory space is available to the microprocessor for storage and execution of code.

The connector 12 and all the key switches are mounted directly to the PC board and, while this design requires more work and therefore more cost at the board level, it imparts a significant amount of ruggedness and stability to the overall device. There are no aspects about the electronic design, however, that are believed to be unique.

In the absence of another command sequence from the on board SRAM, the invention will default to a key press sequence that achieves an ASCII code output described by Endfield called Microwriting. The specific features of this design have been optimized around achieving an effortless implementation of Microwriting with an unsupported single hand.

Operation of Invention

The present invention is a small pocket size device 1 that can be used to generate and record alpha-numeric information interchangeably with either the left or the right hand without having to look at the device. The use of such a device will allow information to be generated and stored for later retrieval by a computer in a variety of conditions such as for example while commuting to work, walking in the woods or in the middle of the night without having to turn on the lights. The device is a self-contained, single-handed but ambidextrous data management device that uses chording to enter data, it has an LCD screen 24 integrated into the design and transfer of the information that has been entered into the device is accomplished via a convenient and easy upload to a computer.

The body of the unit is shaped so that the finger keys 20, 21, 22 and 23 fall at the bottom of the side within ergonomic troughs 27 that fit the fingers and serve as tactile feedback to insure that the fingers are in the correct position. These troughs start from below the keys and extend to the top surface. The finger keys, indeed all the keys on the unit, are simple down close single pole momentary push button only switches. The signal initiation devices referenced earlier by Heusinkveld or by Penner are much more complicated and have multiple-functions-per-finger capability. In their devices, finger position determines the specific character that is being generated. Moreover, they require sliding of the keys while keeping the fingers on the keys. This invention, like the system used with Microwriting, depends on the user being able to release all of the keys in order to register that a chord has been given. A chord sequence will not be recorded as an ASCII character until all the keys of that unit have been released. Any key that is pressed before the last key is released, will count toward making a chord.

For example, if key 22 is pressed first followed by pressing key 20 which is immediately released and then, while still holding down key 22, key 23 is pressed, a release of all keys will record that keys 20, 22 and 23 are the correct key press combination. The order of pressing the keys does not affect the final outcome nor does how long any or all keys are pressed. The character is determined and recorded into memory only when all keys are released and any key pressed during that interval will be counted toward making that chord. This invention has to do with devising and constructing a specific arrangement of keys, or buttons, in multiple planes in an ergonomic case which allows "Microwriter" type of cording to be accomplished with either the left or the right hand without the need to attach anything at all to the hand. The specific shape, size and weight of the unit allows it to be kept in the hand even when all fingers have been removed from the keys.

Optimized Unassisted One Hand "Microwriting"

The invention being disclosed here uses a modification of the type of right hand chording that is described in U.S. Pat. No. 4,360,892 by Endfield. This chording scheme, "Microwriting", has been implemented in a British commercial device called the "Agenda" by Microwriter Inc. In "Microwriting" seven keys are used to access all of the characters of a conventional keyboard; four of said keys are actuated by each of the four fingers that never leave the vicinity of their respective keys and three of the keys are actuated by the thumb of that same hand. One of the three keys for the thumb is the primary thumb key and is accessed each time a thumb key press is required for a chord and each time a space command is accessed.

In this invention the four finger keys 20, 21, 22 and 23 are located on the thin, top, finger-key side of the casing. The primary thumb key for the right hand 17 is located on the face side of the casing near the bottom right corner of the LCD 24. The ergonomic placement of these keys allows for one hand chording with five primary chording keys with the right hand without the need for a secondary surface, a second hand or a back of the hand strap for support. Any combination of the five primary keys for the right hand can be pressed while the device remains stationary in the hand relative to the device's contact position on the palm of that hand. Thus, any chord can be initialized by pressing the required keys and, after all keys have been released, the device will be where it was, relative to the palm of the hand, before the chord was initiated. This tendency of the device to not move relative to the palm of the hand is accomplished because the primary right thumb key 17 is placed on the face side of the casing 25.

The face side of the casing is orthogonal to the thin, top, finger-key side of the casing and therefore simultaneous and independent support for finger key presses and thumb key presses is provided from different parts of the palm of the hand. When the thumb key is the only key that is being pressed, the force from pressing that key is absorbed by pushing the casing into the flat part of the palm of the hand. This should be compared to the device described by Heusinkveld in which the fingers must be kept on the keys of the device all the time or, with the "Agenda" in which the entire unit must rest on either another surface or it must be held in another hand to be used. Another comparison should be made with the device described by Friedman in the December 1992 issue of NASA Tech Briefs. The present device is superficially similar to Friedman's device in that the finger press keys on Friedman's device are located on what could be called a top, thin, finger-key side and with both Friedman's device as well as with the present invention any combination of finger keys can be pressed without moving the placement of the device relative to the palm of the hand. However, the primary thumb key on Friedman's device is located on a thin side of his device, orthogonal to the thin, top, finger-key side and in this position pressing only the thumb key for the space command will tend to move the device in the user's hand down and away from the thumb. The device will tend to be pushed out of the hand by the thumb and therefore chording with Friedman's device will require either a second hand to assist chording or a back of the hand strap to keep his device from moving relative to the palm of the hand.

With this invention the placement of the primary thumb keys 16 and 17 on the face side of the casing 25 allows rapid chording without having to worry about the device moving in the hand and, most importantly as long as there is no relative movement between the device and the palm of the hand, chording can be accomplished independent of the absolute position of the hand. In other words, the hand and chording device combination can be oriented in any direction while "Microwriting", with the palm up, the palm down, the palm sideways, or in any overall orientation the user should desire. One of the key elements of this invention therefore, is the placement of the primary thumb keys 16 and 17 on the face of the device while keeping the finger keys 20, 21, 22 and 23 in an orthogonal orientation which facilitates rapid continuous chording without introducing the danger of dropping the device.

The other buttons for the thumb 14, 15, 18 and 19 are used as shift keys which allows access to all the characters of the QWERTY type of personal computer keyboard. The assignment of any and all of the keys is user selectable so that should the user desire, because of hand shape, hand size, comfort, or simply for personal prejudice, any one of these other keys 14, 15, 18 or 19 can be established as the primary thumb keys. Moreover, when the device is being used by very small hands, the key in the same plane as the fingers seems to be more comfortable, see FIG. 4, although, as mentioned, use of this key as the primary thumb key will limit the hand positions from which chording can rapidly and comfortably be accomplished.

It is a simple matter for the user to reassign the key designations and therefore if a chording sequence other than "Microwriting", such as the Bat Chords used by Infogrip, or, any other sequence is desired the designation of specific chords to specific letters, words, word sequences or even to graphic symbols or sounds is something that can be conveniently and easily selected by the user. The assignments of the specific chord sequences are made by the user on a computer and these assignments are down loaded from that computer to the SRAM memory of the device. In the absence of a downloaded chord translation table, the unit will default to the Microwriter chord sequence.

Multiple Hand Sizes

Figure 3:
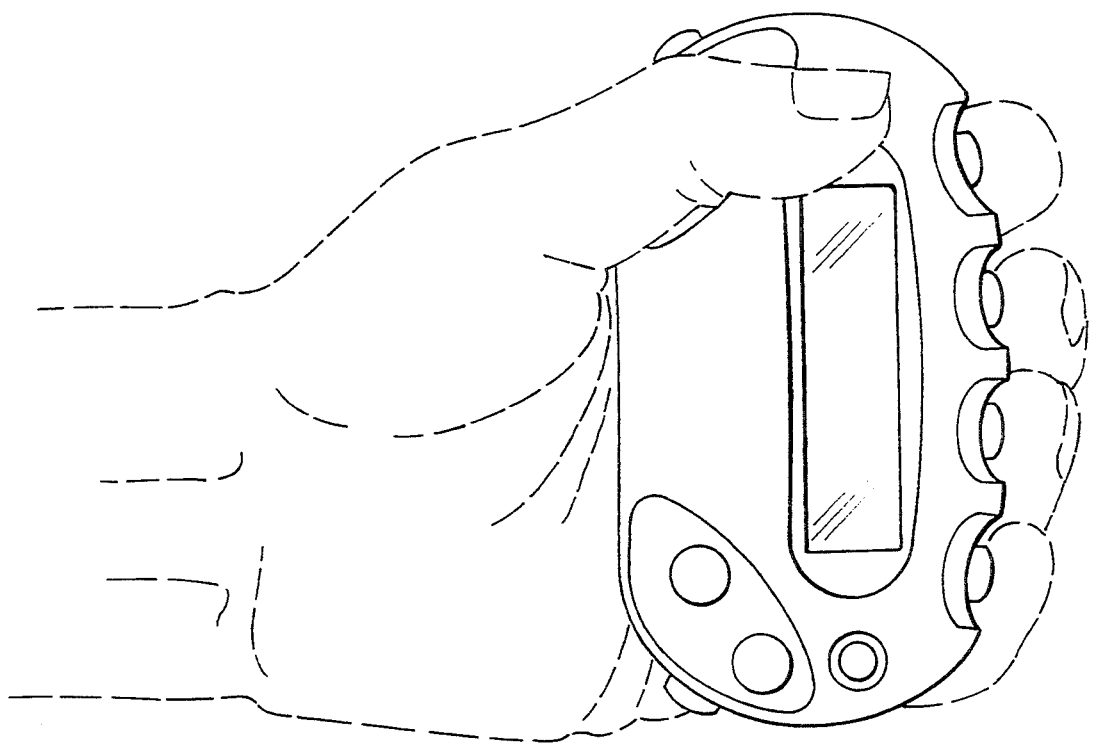
FIG. 3 is a drawing of a hand holding the device in the normal mode where the thumb button is on the face of the device.
Figure 4:
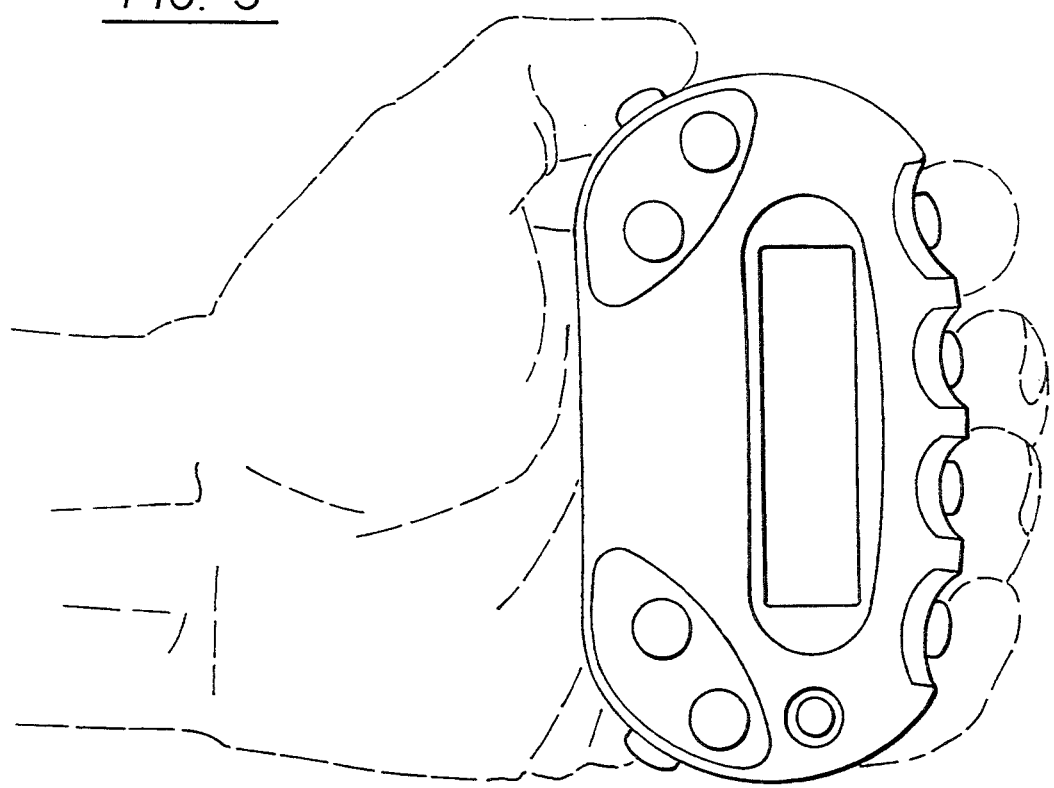
FIG. 4 is a drawing of a hand holding the device and using the key on the thin side for the primary thumb button.

With the present invention the four finger keys 20, 21, 22 and 23 were placed with an ergonomically optimized spacing between keys in order to achieve a similar spacing between fingers for a plurality of hand sizes. This optimized finger spacing is accomplished by placing the finger keys along an arc whose plane is parallel to the face of the casing and asymmetrically below the center line of the thin, top, finger-key side. These finger keys are placed decidedly toward the back side of the casing with no obstruction for the fingers which allows fingers of larger hands to wrap well past the keys and rest on and hold onto the casing while providing sufficient surface for fingers of smaller hands to hold onto and grip the casing before the finger keys which is illustrated in FIGS. 3 and 4. Therefore, hands of different sizes press keys with different parts of the fingers, larger hands pressing the keys with the part the fingers closer to the palm of the hand, before the first or second knuckle, and smaller hands pressing the keys with the finger tips.

By allowing larger hands to wrap the fingers around the casing and to initialize the keys with that part of the finger that is closer to the base of the hand, those larger hands will be in a greater state of hand closure when they are gripping the invention than the state of closure of smaller hands that are gripping the device with the finger tips. As the human hand is opened in a relaxed state, the fingers of the hand that is opening will tend to separate so that smaller hands gripping the device would have less closure, more openness of the hand, and therefore, a wider relative finger spacing than larger hands that are gripping the device. Larger hands would have more hand closure and therefore closer finger spacing. Smaller hands that are open achieve finger spacings at the finger tips similar to the finger spacings closer to the palm of the hand of partially closed, larger hands. The use of this "iso finger spacing" zone that depends on a variable hand closure and the natural decrease in finger spacing based on that hand closure is a key element in this invention that provides comfortable chording to a wide variety of hand sizes that ranges from ten year old children through to larger than average sized people such as college basketball players.

Ambidexterity

The device has been ergonomically optimized to facilitate data entry with either hand and when "Microwriter" chords are being entered with the left hand the same relative finger key sequences are preserved. For example, the "Microwriter" chord for the letter "A" requires that the index finger and the middle finger on the right hand be depressed. The generation of the letter "A" with the left hand also requires the that the index finger and the middle finger of the left hand be depressed. An experimentally verifiable phenomenon is that if a user learns to chord with the hand that is opposite from their handedness, that is if a right handed person learns to chord with their left hand, the speed with which they can chord using that opposite hand, i.e., the chording speed with the left hand for a right handed user is automatically transferred to the right hand with little or no practice with the dominant hand.

This ambidexterity was accomplished by adding an additional set of three thumb keys 14, 15 and 16 to the bottom left corner of the device which resulted in a bilaterally symmetric device. For chording functionality, that is ignoring the "On" button 13 and the connector 12, the device is bilaterally symmetric with the left side of the device being identical to the right side. In order to achieve ambidextrous chording however the device has to have an automatic switching of its "handedness".

There are three separate keys for each of the two thumb positions, 14, 15, and 16 for the thumb of the left hand and 17, 18 and 19 for the thumb of the right hand making a total of six separate keys for the thumbs. However, only one set of thumb switches or keys is enabled at a time. Only one set of keys are active at one time but, when the main thumb key for the hand that was not in use is depressed, the corresponding handedness for that key is imparted to the unit, the two other keys associated with that thumb are made active and the three keys that were active become inactive.

The roll of each of the finger keys 20, 21, 22 and 23 is changed depending on whether the unit is being used as a left handed or as a right handed unit. The specific character that each key combination generates, is completely altered, in a way, reversed, when the space bar command is generated with the opposite hand, that is when the primary thumb button of the other hand is pressed. Therefore, when the thumb switch 16 for the left hand is depressed directly after the unit has been used to chord with the right hand, the function of all the buttons changes to accommodate the left hand cording sequence. For example, when the "Microwriter" chord for the letter "T" using keys 20 and 22 is initiated with the right hand, that right hand key press combination would produce the same letter, the letter "T", with the left hand if buttons labeled 21 and 23 were pressed. Thus, in this system when the "Microwriting" chords are being used, a maximum of one word would be garbled if the user forgot to press the space button before chording with the other hand since the next space between two words would shift the handedness of the unit.

Uses For The Built in LCD

The unit has a "Liquid Crystal Display" (LCD) 24 that shows the specific symbol, letter or number, that the last chord represents. The last symbol to be entered will be displayed in the top right screen position and previously entered symbols will scroll, in the order they are entered, from right to left as more symbols are entered.

The specific status of the unit will be displayed in the far left-top screen position of the LCD unit. This position will be marked as a permanent, external to the LCD, on the unit label as "Status". When the unit is in the mode of generating lower case letters, a small case "a" will appear in the status position of the screen, when it is in the mode of generating capital letters only for the next chord, such as at the beginning of a sentence, an uppercase "A" will appear and when it is in the mode of producing uppercase letters all the time, a reverse video uppercase "A" will appear in the far left position of the LCD screen. Similarly, when the unit is in the number generation mode, a "1" will appear in the far left screen position.

Operational Features

When a specific chord or chord sequence called "end/beginning of file" is given, the unit will end the particular string of code it has been storing, the LCD screen will go blank and the device will go into a "beginning of file" mode. There is a real time clock within the unit and this clock is used, as mentioned above, to "time stamp" new files. In this "beginning of file" mode, the unit enters the time of day and date internally within the unit in such a way that a file structure, a file allocation table, can be built on the host computer at the time of downloading the contents of the device designating the name of the next file. The first eight characters entered after a "new file" command is given, will scroll from left to right, the opposite direction from the normal direction. These eight symbols, letters numbers or whatever, are used, along with the date and time stamp, to designate the new file.

When the contents of the unit are downloaded to a computer, in addition to the linear string of text associated with each file, a file directory for the contents of the unit will be created that will contain 1. the names of the files, 2. the file sizes, 3. the date and time the file was started. These files will contain standard ASCII text and they will be readable and modifiable just as any string of ASCII code is modifiable on a computer using word processor software like, for example, "Word Perfect" or "Word For Windows".

Resident Code Execution

The electronic design has been done in such a way that part of the SRAM memory space can be allocated to execution code that runs on the microprocessor. This feature allows the unit to be programmable. Thus, the unit will contain battery backed up static random access memory (SRAM)and if specific execution code has been entered into the device from the computer, whatever command set has been entered into the unit, for example a specific chord-symbol code combination, will be stored in this executable SRAM memory space. Some examples of programs that use this executable code space to enhance the capability of the device and still use the basic elements of one hand chording are described next.

Next Letter Search Mode

If a unit has been allowed to turn itself off automatically because no keys were depressed within a specific amount of time, the current real time and date is displayed on the LCD 24. The processor is shut down in this mode and, to begin cording, the unit will have to be actively turned on with the start key 13. The start key will not be active for cording and it will be used only for two purposes, to turn the unit back on and for the Next Character Search Mode. Once the start key 13 has been depressed the unit will display the text, or symbol, that was on the unit when it automatically powered down. A second depression of the start key while the unit is in the active chording mode, that is, before a specific time has elapsed without a chording key being pressed, will put the unit into the Next Character Search Mode.

Figure 6:
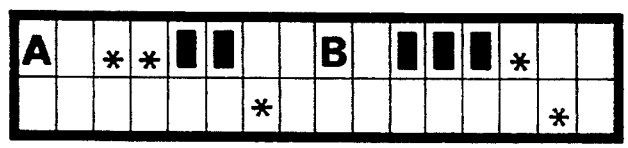
FIG. 6 is a close up view of the LCD when it is in the next letter search mode.

A Next Character Search mode of operation is needed because specific letters cannot be labeled on the keys or on the device. This mode of operation has been designed for novice chord users who might not have learned the key combinations of all the chords. The next letter search mode provides an on-the-LCD graphic representation for the specific keys that were actually pressed to generate the last chord that was entered in the device. It also provides the letter that corresponds to this last chord and that letter appears in the top left corner of the LCD. The letter of the last chord and its corresponding graphic representation for that chord, occupy the first eight columns of the LCD as shown in FIG. 6. The last eight columns of the LCD show the next letter in the alphabet as well as the graphic representation of the chord that should be pressed to initialize it. In FIG. 6 the letter "A" and the graphic representation for its chord are shown in the first eight columns and, the letter "B" and its graphic representation are shown in the second eight columns. This next letter search mode enables any letter and the next letter in the alphabet, together with graphical representations of those letters, to be selected and displayed on the screen. Thus, the correct key press combination for "Q", an infrequently accessed letter, can be found by initializing the correct key press combination for "P". Once that character has been chorded, the screen will return to its original mode, displaying text.

Database Mode

"Database" mode is a software upgrade that has been developed to allows the user to enter data into the device in a different way than that described above. Rather than generate continuous variable length ASCII code files, only 32 bytes of code will be entered into each file. There will be two rows of sixteen characters visible on the LCD but the characters will not scroll. Moreover, these entries will have no file name associated with them nor will they have a time or date stamp. When data are entered into a file in the "Database" mode the file can be ended before thirty two characters have been entered but the entries plus the empty place holders up to 32 bytes total will be stored in the SRAM memory. Thus, for example, an allocation of 32K bytes of memory space would hold one thousand "Database" entry files.

The individual entries in the "Database" can be viewed serially by scrolling forward or backward or, they can be searched for by symbol sequence. For example, if the "Database" contains names and phone numbers, the entries can be searched by cording the first or last name of the entry and the device will search the "Database" files to find that particular entry. The first occurrence of that letter sequence, or number sequence will be displayed. Once the desired name or number sequence has been found, subsequent occurrences of that name or number sequence can be scrolled through just as if sequential entries were being scrolled through. The unit is capable of entering, storing and accessing databases which include names and phone numbers but it is by no means limited in this way. The device will work equally well for lists of pads, prices or even for random entry of text strings that are only thirty two characters in length.

Study-Learning Tool

A further refinement of the "Database" mode of operation is the Study-Learning mode of operation. The thirty two character strings of data, mentioned, above can be linked in almost any way to provide an operational mode that converts the unit into a completely mobile and convenient study and learning tool.

This study and learning program on the device would provide a visual prompt of study material on the LCD of the device and it would first display only a word or phrase without the corresponding meaning for the word or phrase from a list compiled on a computer. These lists would be easily and conveniently compiled in a specialized utility on a PC and downloaded into the device or, alternatively, the lists can be compiled on the device itself by entering the items to be connected manually. Once the user presses a specific combination of key closures, the meaning of the word or phrase would be displayed on the screen. The entire list of items the user wishes to learn followed by their corresponding meanings can be cycled through very quickly. Should the user desire to eliminate a pair of items, the word and its meaning, from the list they can do so by pressing the proper key sequence. In this way the user can specifically eliminate words or phrases that they know and concentrate on looking at and cycling through those items that they do not know or understand.

Any of the lists can be extensively scrambled without mixing up the one to one correspondence between the words or phrases and their corresponding meanings. Therefore, after items have been deleted from the list, the remaining list can be scrambled and the process can be repeated or the user can choose to restore the original list and scramble it for re-review. The portability and convenience of viewing and reviewing such study lists make the ambidextrous device described in this invention an ideal portable study aid.

Programmed Learning Tool

A specialized program for learning the "Microwriting" chord sequence is available as a download from a computer. The program is a sequential and automated visual training program for learning the specific keys that need to be pressed to generate a desired letter, or character, for learning chording. In the normal mode of operation a suggested next character that should be chorded is presented on the LCD and after a thumb key press, a visual representation of the keys that have to be pressed to generate that chord is presented to the user on the LCD screen. Once the proper chord has been pressed corresponding to the suggested letter, another character is presented and the process is repeated. This process of suggesting seemingly random characters is repeated, over and over again with different characters, so that eventually all of the characters within the desired learning routine have been displayed.

Memory Upload to a Computer

At any time the user may upload, in a non-destructive way, the contents of the unit from the SRAM memory. The upload can be accomplished by using a serial cable supplied with the unit that will allow a linkage from the connector port on the device 12 to the computer via that computer's serial port. A specific command from the computer is required for the upload and it will not occur unless the specific software for the device is loaded onto the computer. Similarly the memory contents of SRAM memory in the device cannot be erased from within the device. The erasure of the SRAM memory of the device can only be initiated from a computer that is linked to the device via the special serial port cable.

Use As A Computer Keyboard

In addition to using the unit as a stand alone note taker or small database filer, it can be used to make key stroke entries to a computer. In this mode it can enter data through the serial cable or through a special keyboard cable and, real time, as specific chords are pressed on the unit, they will be represented as ASCII input to the computer to which it is attached. When the unit is being used as a chord keyboard it will still store the chord sequences into the local SRAM memory of the device.

A Stand Alone Two Hand Data Management Device

If the serial connector of one unit, unit A, is input into the connection port of another unit, unit B, then unit A, the unit that is connecting in, will act as a slave unit of the second unit, unit B, the unit that is being connected to. In this mode the primary unit, unit B, (the unit that is being connected to) will have a file which consists of a combination of the ASCII character inputs from the two units. These tandem devices will produce a two handed chording scheme in which a chord on either one of the devices produces the stand alone conventional chord in that specific device. Just as with a single unit, the timing for sending the ASCII character of the slave unit will be gaited by the release of all buttons on that slave unit. Once a symbol from the slave unit is sent to the master unit that symbol will be stored into the memory of the master unit as though that chord had come from within the master unit. This function will allow for two handed operation of note taking.

The initial implementation of the device only records information from the slave unit when that unit has completed a specific chord and has arrived at an all key up situation. However, two handed multi-finger cording from both units at the same time is possible and can be accomplished by a software upgrade with the code for that capability being downloaded from the host computer into the SRAM memory space of both units. Thus it would be possible to construct a ten digit phonetically based input scheme similar to court recording.

The invention described here has been reduced to practice and all of the functions described have been implemented on the working models. More importantly, the unit has been designed so that it can be manufactured at a low cost. Only the essential functions of data entry have been preserved and other more complex, and therefore more expensive, functions, like true word processing for example, have been left out. These more expensive and complex functions, however, can be done on this unit. Only the basic minimum required for usefulness has been implemented in the first embodiment. By providing a low cost single hand chord note taker it is believed that some of the paradigm of the monopoly of the QWERTY keyboard can be broken. Once the paradigm has been broken many of these more complex, and therefore more expensive, capabilities can be added to the unit. Specific examples of areas we are working on as additions to the basic unit are;

Infra red communication link capability for more facile communication with the host computer.

Radio frequency receive and transmit for use in pager networks, cellular phone communications as well as local area networks.

Use in remote machine control via cable, IR or RF.

Use in letter, word, and text to speech generation as a tool to help the dumb as well as an enhancement to the study-learning capability that was described above.

It is expected that these and many other uses of the fundamental data input methodology that is described here will emerge as more and more people become accustomed to single hand, unassisted Microwriting.

What is claimed is:

1. A self contained, ambidextrous, manually-operable, chordic-keyboard data-input, data management device comprising in combination;

(a) a pocket-sized, ergonomically-designed casing that is sized to be gripped and can be operated by either the left or right hand, with said casing capable of accommodating different hand sizes, said casing gripped by fingers of a hand in contact with a thin, top, finger-key-side of said casing and a part of a palm of said hand in contact with a thin, bottom side of said casing, and said casing gripped by a thumb of said hand in contact with a face side of said casing and the front part of said palm of said hand in contact with a back side of said casing;

(b) a programmable microprocessor, semiconductor memory, a liquid crystal display contained within the housing, and a plurality of digital logic signal lines, said signal lines connected between said microprocessor, memory and display, said signal lines including means to communicate a signal between said microprocessor, said memory and said display;

(c) means for introducing a multiplicity of digital logic signals into the programmable microprocessor, for displaying an alpha numeric representation of said digital logic signals on said liquid crystal display and for storing an electronic record of said logic signals in said semiconductor memory that is accomplished by pressing and then releasing, down close only, single-pole, momentary push button keys; four of said keys, a set of finger keys, mounted on said thin, top, finger-key side of said casing, at least one of said keys, a right hand thumb button, mounted on said face side of said casing, near the right side of said face side, inaccessible to the left hand holding said device, at least one of said keys, a left hand thumb button, mounted on said face side of said casing on the left side of said face side, inaccessible to the right hand holding said device, each of said keys being associated with only one key-down closing function, and said casing and keys configured so that all said keys can be pressed and released to the extend that all said keys are up and open while said ambidextrous device is being held only with a left or a right hand and said key press and release is accomplished without movement of said device in said hand, independent of the orientation of said hand and without dropping the device, wherein the device further comprises;

(a) means for providing a next letter search mode of operation that is needed because specific letters can not be labeled on the keys or on the unit;

(b) said next letter search mode provides a visual prompt on said liquid crystal display of the device;

(c) said next letter search mode is accessed with a specific combination of key press sequences and when said next letter search mode is accessed, a specific and different graphic appearance will be visible on the liquid crystal display;

(d) said next letter search provides means to improve the ease of use of said ambidextrous device by generating an on-the-liquid-crystal-display prompt which is a graphic representation for the specific keys that were actually pressed to generate the first of the only two letters which are displayed on the liquid crystal display screen;

(e) means for said liquid crystal display screen on said ambidextrous device in the next letter search mode to display the next letter in the alphabet and a graphical representation for said next letter as the second and only other letter on the liquid crystal screen, said screen showing two letters, in alphabetical order and their respective graphical key press combinations, chords, in which the first letter on said display is the last letter entered on the unit, the last chord;

(f) said next letter search mode enables any letter and the next letter in the alphabet, together with said two letters respective graphical representations, to be selected and displayed on the screen.

2. A self contained, ambidextrous, manually-operable, chordic-keyboard data-input, data management device comprising in combination;

(a) a pocket-sized, ergonomically-designed casing that is sized to be gripped and can be operated by either the left or right hand, with said casing capable of accommodating different hand sizes, said casing gripped by fingers of a hand in contact with a thin, top, finger-key-side of said casing and a part of a palm of said hand in contact with a thin, bottom side of said casing, and said casing gripped by a thumb of said hand in contact with a face side of said casing and the front part of said palm of said hand in contact with a back side of said casing;

(b) a programmable microprocessor, semiconductor memory, a liquid crystal display contained within the housing, and a plurality of digital logic signal lines, said signal lines connected between said microprocessor, memory and display, said signal lines including means to communicate a signal between said microprocessor, said memory and said display;

(c) means for introducing a multiplicity of digital logic signals into the programmable microprocessor, for displaying an alpha numeric representation of said digital logic signals on said liquid crystal display and for storing an electronic record of said logic signals in said semiconductor memory that is accomplished by pressing and then releasing, down close only, single-pole, momentary push button keys; four of said keys, a set of finger keys, mounted on said thin, top, finger-key side of said casing, at least one of said keys, a right hand thumb button, mounted on said face side of said casing, near the right side of said face side, inaccessible to the left hand holding said device, at least one of said keys, a left hand thumb button, mounted on said face side of said casing on the left side of said face side, inaccessible to the right hand holding said device, each of said keys being associated with only one key-down closing function, and said casing and keys configured so that all said keys can be pressed and released to the extend that all said keys are up and open while said ambidextrous device is being held only with a left or a right hand and said key press and release is accomplished without movement of said device in said hand, independent of the orientation of said hand and without dropping the device, wherein the improvement further comprises;

means for providing downloading of software programs from a host computer into said semiconductor memory of the ambidextrous device and which allows the ambidextrous device to adopt a multiplicity of functions that is accomplished by connecting said ambidextrous device to a computer and loading a desired program into an executable space of the semiconductor memory;

wherein the improvement further comprises;

(a) means for providing as an option, a sequential and automated visual training program for learning the specific keys that need to be pressed to generate a desired letter or character, for learning chording;

(b) said learning program to appear on said liquid-crystal-display when said learning program has been downloaded into the semiconductor memory from a computer and when the keys are pressed in a learning program initiation sequence, (c) said program to provide a suggested next character and a visual representation of the keys that have to be pressed, the chord, required to generate the suggested character, and, after the correct combination of keys, the correct chord, has been pressed, the program provides an additional suggested character with its appropriate key combination graphically displayed on the liquid crystal display;

(d) said process of presenting seemingly random characters being repeated, with different characters so that eventually all of the characters within the desired learning routine are displayed.

3. A self contained, ambidextrous, manually-operable, chordic-keyboard data-input, data management device comprising in combination;

(a) a pocket-sized, ergonomically-designed casing that is sized to be gripped and can be operated by either the left or right hand, with said casing capable of accommodating different hand sizes, said casing gripped by fingers of a hand in contact with a thin, top, finger-key-side of said casing and a part of a palm of said hand in contact with a thin, bottom side of said casing, and said casing gripped by a thumb of said hand in contact with a face side of said casing and the front part of said palm of said hand in contact with a back side of said casing;

(b) a programmable microprocessor, semiconductor memory, a liquid crystal display contained within the housing, and a plurality of digital logic signal lines, said signal lines connected between said microprocessor, memory and display, said signal lines including means to communicate a signal between said microprocessor, said memory and said display;

(c) means for introducing a multiplicity of digital logic signals into the programmable microprocessor, for displaying an alpha numeric representation of said digital logic signals on said liquid crystal display and for storing an electronic record of said logic signals in said semiconductor memory that is accomplished by pressing and then releasing, down close only, single-pole, momentary push button keys; four of said keys, a set of finger keys, mounted on said thin, top, finger-key side of said casing, at least one of said keys, a right hand thumb button, mounted near a first corner of said face side of said casing adjacent said thin bottom side of said casing, at least one of said keys, a left hand thumb button, mounted near a second corner of said face side of said casing adjacent said thin bottom site of said casing, each of said keys being associated with only one key-down closing function, and said casing configured so that all said keys can be released to the extent that all said keys are up and open while said ambidextrous device is being held only with a left or a right hand and said release is accomplished independent of the orientation of the hand without dropping said device, wherein the improvement further comprises;

means for providing downloading of software programs from a host computer into said semiconductor memory of the ambidextrous device and which allows the ambidextrous device to adopt a multiplicity of functions that is accomplished by connecting said ambidextrous device to a computer and loading a desired program into an executable space of the semiconductor memory;

wherein the improvement further comprises;

(a) means for providing a completely mobile and convenient study and learning tool (b) said study and learning program provides means for a visual prompt of study material on said liquid crystal display of the device;

(c) said study prompt first displays only a word or phrase without the corresponding meaning for the word or phrase from a list of words or phrases and meanings compiled on a computer, said list having been downloaded from said computer into said semiconductor memory of the device, or, said list having been manually compiled by chording in the information with said keys on said device;

(d) means for cycling to the meaning of the word or phrase, said meaning intimately linked to the word or phrase, that is accomplished by effecting a specific combination of key closures, said meaning having been included on said list with the original download from the computer or said meaning could have been added to the list manually;

(e) means for cycling through said list of words and phrases and their meanings rapidly and means to specifically eliminate words or phrases and their corresponding meanings from said list;

(f) means to cycle through a modified list after items have been deleted and not show the deleted items;

(g) means to scramble within the ambidextrous device the order of said modified list or to scramble the order of the original list and to review either of said scrambled lists without mixing up the one to one correspondence of the words or phrases and their meanings.

4. A self contained, ambidextrous, manually-operable, chordic-keyboard data-input, data management device comprising in combination;

(a) a pocket-sized, ergonomically-designed casing that is sized to be gripped and can be operated by either the left or right hand, with said casing capable of accommodating different hand sizes, said casing gripped by fingers of a hand in contact with a thin, top, finger-key-side of said casing and a part of a palm of said hand in contact with a thin, bottom side of said casing, and said casing gripped by a thumb of said hand in contact with a face side of said casing and the front part of said palm of said hand in contact with a back side of said casing;

(b) a programmable microprocessor semiconductor memory, a liquid crystal display contained within the housing, and a plurality of digital logic signal lines, said signal lines connected between said microprocessor, memory and display, said signal lines including means to communicate a signal between said microprocessor, said memory and said display;

(c) means for introducing a multiplicity of digital logic signals into the programmable microprocessor, for displaying an alpha numeric representation of said digital logic signals on said liquid crystal display and for storing an electronic record of said logic signals in said semiconductor memory that is accomplished by pressing and then releasing, down close only, single-pole, momentary push button keys; four of said keys, a set of finger keys, mounted on said thin, top, finger-key side of said casing, at least one of said keys, a right hand thumb button, mounted on said face side of said casing, near the right side of said face side, inaccessible to the left hand holding said device, at least one of said keys, a left hand thumb button, mounted on said face side of said casing on the left side of said face side, inaccessible to the right hand holding said device, each of said keys being associated with only one key-down closing function, and said casing and keys configured so that all said keys can be pressed and released to the extend that all said keys are up and open while said ambidextrous device is being held only with a left or a right hand and said key press and release is accomplished without movement of said device in said hand, independent of the orientation of said hand and without dropping the device, wherein the improvement further comprises;

(a) means to connect two of the ambidextrous devices in tandem;

(b) means for said tandem devices to produce a two handed chording scheme in which a single chord including keys from both devices produces a character in one of the devices is representative of a phonetic sound;

(c) means for recording in one of the two devices the chords from both of said devices in the order that they are generated which would result in only one of the devices having the desired information;

(d) means to alter the tandem function via a download to both units to convert them into a new system of input to produce a ten digit phonetically based input scheme similar to court recording.

5. A device for generating a signal representative of elements of a human language from human hand motions comprising in combination:

a) a casing sized to be graspable by a hand of a user;
b) said casing including a back side, a face side opposite said back side, and a top edge extending between said face side and said back side;
c) a plurality of buttons extending from said casing and having an unpressed position and a pressed position closer to the casing than the unpressed position, said buttons coupled to a means to generate said signal;
d) said plurality of buttons including a plurality of finger buttons extending from said top edge of said casing in a common, finger button plane between said face side and said back side;
e) said plurality of buttons including at least one thumb button extending from said face side of said casing, said thumb button oriented to move along a line non-parallel with said finger button plane.

6. The device of claim 5 wherein said casing includes a plane of symmetry substantially perpendicular to said finger button plane, passing through said top edge, and substantially bisecting said casing conceptually into a right half and a left half, said plurality of buttons including at least two thumb buttons including at least one right thumb button extending from said right half of said face side of casing and at least one left thumb button extending from said left half of said face side of said casing, said left thumb button oriented spaced from said plane of symmetry in a configuration mirroring a configuration of said right thumb button from said plane of symmetry.

7. The device of claim 6 wherein both said right thumb button and said left thumb button are coupled to said means to generate said signal in at least two modes including a right hand mode and a left hand mode, said device in said right hand mode including means to interpret movement of said right thumb button between said unpressed position and said pressed position as being indicative of an element of a human language, and including means to allow movement of said left thumb button between said unpressed position and said pressed position to cause the device to change from said right hand mode to said left hand mode.

8. A device of claim 7 wherein said finger buttons include four of said plurality of buttons extending from said top edge of said casing, said finger buttons including a right hand index finger button, a right hand middle finger button, a right hand ring finger button and a right hand little finger button, said four finger buttons coupled to said means to generate said signal while said device is in both said right hand mode and said left hand mode, said right hand index finger button having a similar affect on said signal when moved between said unpressed position and said pressed position while said device is in said right hand mode as an affect movement of said right hand little finger has on said signal when said device is in said left hand mode.

9. The device of claim 7 wherein said top edge includes at least four troughs therein extending substantially perpendicular to said finger button plane, said troughs having a width similar to a width of a human finger, each said trough including one of said finger buttons therein.

10. The device of claim 7 wherein said finger buttons are oriented closer to said back side of said casing than to said face side of said casing, such that a user with small hands can still reach around said back side with tips of the user's fingers to engage said finger buttons and a user with larger hands can extend a palm of the hand over the back side and extend the fingers over the buttons, allowing either a user with large hands or a user with small hands to use a device having a similarly dimensioned casing.

11. The device of claim 7 wherein said face side of said casing includes a display means thereon, said display means including means to graphically represent the elements of the human language that said signal represents.

12. The device of claim 7 wherein said face side includes a left thumb button recess and a right thumb button recess in a portion of said face side adjacent a bottom edge extending between said face side and said back side and opposite said top edge, said recesses oriented substantially parallel to said face side and closer to said back side than a distance between said face side and said back side, whereby thumbs of a user more easily wrap around said casing to address said buttons.

13. The device of claim 7 wherein said buttons are down close only, single-pole, momentary push button keys.

14. The device of claim 7 wherein said device includes a search mode, said search mode including:
 means to input a signal caused by the movement of certain of said buttons between said unpressed position and said pressed position in a pattern representative of an element of a human language,
 means to determine which elements are sequentially adjacent to the element input by input means, and
 means to display on said display means a representation of the configuration of buttons to be moved to generate both the element received by said input means and at least one of said sequentially adjacent elements, whereby a user is trained to effectively operate said device.

15. The device of claim 5 wherein said thumb button is oriented to move along a line substantially perpendicular to said finger button plane, whereby said casing can be grasped by a user's hand with a thumb overlying said face side and a palm overlying said back side, supporting said casing while said casing is in any orientation in free space without moving from the hand both while said plurality of buttons are being pushed by the fingers and a thumb of a user and while said buttons are not being pushed, thereby allowing the user to utilize said device while said casing is in any orientation in free space.

16. A device for creating an electronic signal representing a sequence of alphanumeric characters from digit motion of either a human left hand or a human right hand, comprising in combination:
 a) a casing including a back side, a face side opposite said back side, a top edge extending between said face side and said back side, and a plane of symmetry passing substantially perpendicularly through said face side, said back side and said top edge;
 b) a plurality of finger buttons extending from said top edge of said casing;
 c) at least one right thumb button extending from said right half of said face side of said casing;
 d) at least one left thumb button extending from said left half of said face side of said casing, said right thumb button and said left thumb button oriented symmetrically with each other about said plane of symmetry;
 e) said plane of symmetry oriented such that said casing exhibits a right half and a left half which substantially mirror each other in button orientation.

17. The device of claim 16 wherein said device includes a right hand operation mode and a left hand operation mode, said right hand operation mode including means to utilize said right thumb button for creating alphanumeric characters within said signal and said left thumb button with means to switch said device from said right hand mode to said left hand mode, said left hand mode including means to utilize said left thumb button for creating alphanumeric characters within said signal and said right thumb button with means to switch said device from said left hand mode to said right hand mode,
 said plurality of finger buttons include a right half end finger button, a right half middle finger button, a left half middle finger button and a left half end finger button,
 said right hand mode and said left hand mode configured such that an effect produced by activating a right half end finger button in said right hand mode is similar to an effect produced by activating said left half end finger button in said left hand mode and an effect produced by activating said right half middle finger button in said right hand mode is similar to an effect produced by activating said left half middle finger button in said left hand mode.

18. The device of claim 16 wherein said finger buttons are oriented within a common finger button plane, said thumb buttons oriented to be depressed in a direction not parallel to said finger button plane.

19. A method for entering alphanumeric information into a device with either a left human hand or a right human hand, the steps including:
 providing a casing for the device including a face side, a back side opposite the face side, a top edge extending between the face side and the back side, a bottom edge opposite the top edge extending between the face side and the back side, at least four finger keys extending from the top edge of the casing, a right thumb button extending from the face side of the casing and a left thumb button extending from the face side of the casing, the right thumb button located in an orientation with respect to the finger buttons allowing the right hand of the user to grasp the casing in a first orientation, the left thumb button oriented with respect to the finger buttons so that the left hand of the user can grasp the device in a second orientation, the first orientation and the second orientation being substantially mirror-images of each other, such that the device can be grasped with the right hand of the user in a similar manner as the device can be grasped with the left hand of the user except that the right hand of the user has the right thumb button adjacent the right thumb of the user and the left thumb button is oriented adjacent the left thumb of the user,
 entering at least one chord of data into the device by moving at least one of the buttons of the device including the right thumb button,
 switching the device from a right hand operation mode to a left hand operation mode by moving the left thumb button, and
 entering at least one chord of data into the device by moving at least one of the buttons including the left thumb button.

* * * * *